United States Patent
Matschl et al.

(10) Patent No.: US 7,030,614 B2
(45) Date of Patent: Apr. 18, 2006

(54) METHOD AND SELECTOR SWITCH FOR SWITCHING BETWEEN TWO ANTENNA UNITS

(75) Inventors: Volker Matschl, Bamberg (DE); Arne Reykowski, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/997,309

(22) Filed: Nov. 24, 2004

(65) Prior Publication Data
US 2005/0156598 A1   Jul. 21, 2005

(30) Foreign Application Priority Data
Nov. 28, 2003   (DE) ................ 103 56 273

(51) Int. Cl.
*G01V 3/00* (2006.01)
(52) U.S. Cl. ..................... 324/318; 324/322
(58) Field of Classification Search ........... 324/318, 324/322; 600/410, 422
See application file for complete search history.

(56) References Cited

U.S. PATENT DOCUMENTS

| 4,881,034 A | * | 11/1989 | Kaufman et al. ........... 324/318 |
| 5,097,210 A | | 3/1992 | Requardt et al. |
| 6,223,065 B1 | * | 4/2001 | Misic et al. ............... 600/410 |
| 6,867,593 B1 | * | 3/2005 | Menon et al. ............. 324/318 |

* cited by examiner

*Primary Examiner*—Louis Arana
(74) *Attorney, Agent, or Firm*—Schiff Hardin LLP

(57) ABSTRACT

In an antenna selector switch and a switching method, a number of antenna units of a magnetic resonance apparatus can be operated via one RF channel. The antenna selector switch has at least two antenna connectors for connection with one antenna unit. A first of the antenna units can be set in terms of its resonance frequency via a control signal. The selector switch also has an RF channel connector for making a connection with a radio frequency unit of the magnetic resonance apparatus; and a switching unit to make a radio frequency connection between one of the antenna connectors and the RF channel connector. The switching unit can activated with the control signal. This allows a reduction of the necessary reception channels without additional control signal lines.

12 Claims, 3 Drawing Sheets

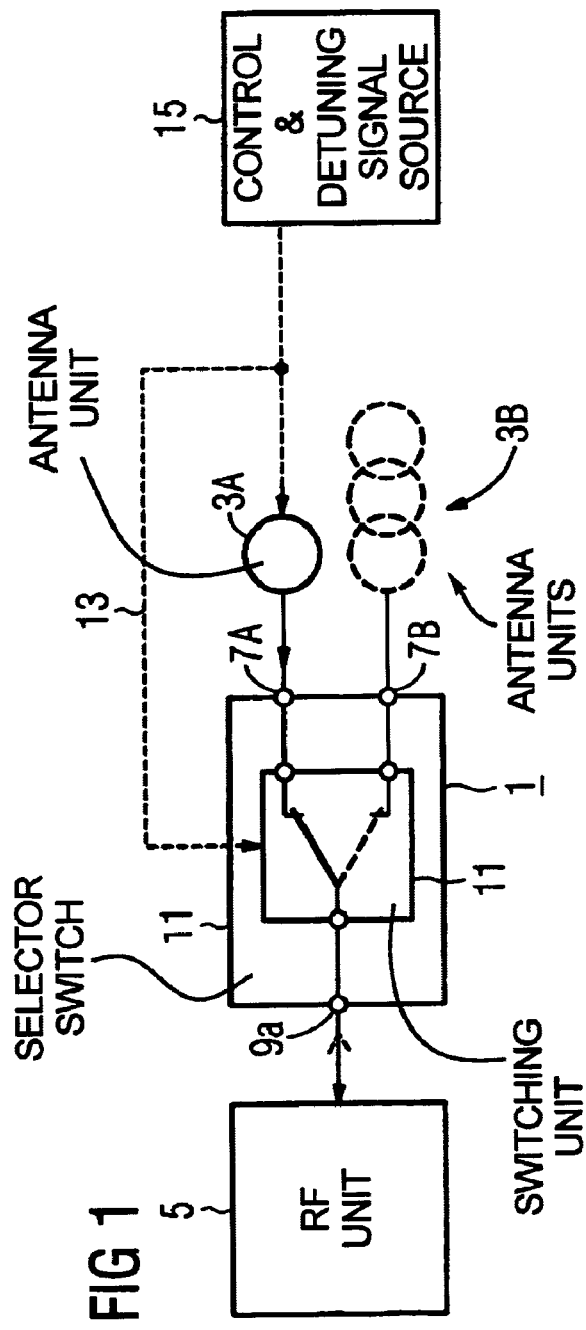
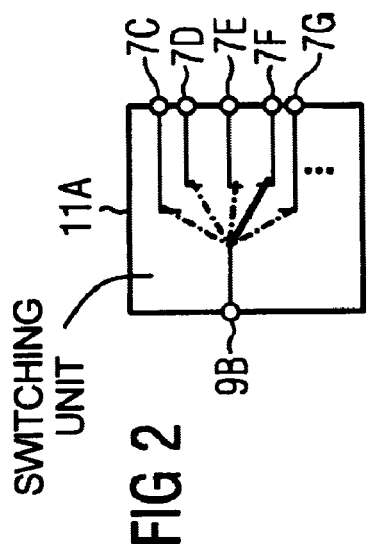

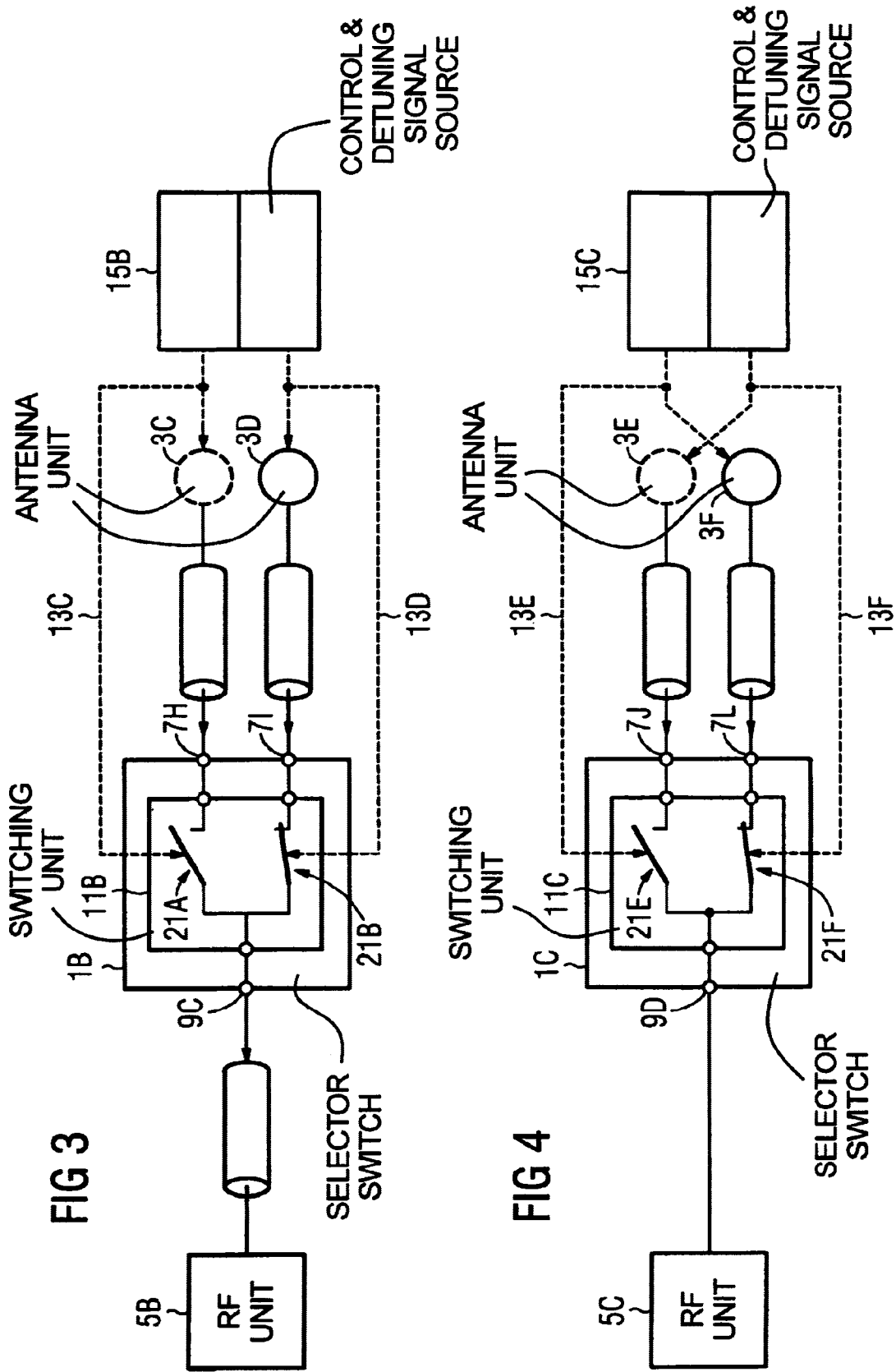

METHOD AND SELECTOR SWITCH FOR SWITCHING BETWEEN TWO ANTENNA UNITS

BACKGROUND OF THE INVENTION

1. Field of the Invention

The present invention concerns an antenna selector switch to operate a number of antenna units of a magnetic resonance apparatus via an RF channel. The invention also concerns a method to switch between at least two antenna units.

2. Description of the Prior Art

Magnetic resonance is a known modality to, among other things, acquire images of the inside of a body of an examination subject. In a magnetic resonance (MR) apparatus rapidly switched gradient fields are superimposed on a static basic magnetic field B0 that is generated by a basic field magnet. To excite MR signals, the MR apparatus also has a whole-body radio frequency (RF) antenna that radiates RF signals (known as the B1 field) into the examination subject. The excited magnetic resonance signals can be acquired by the same antenna that was used to radiate, or with a different antenna such as a local antenna. The received signals are processed to form an image.

Antenna arrays are typically used in MR tomography. An antenna array has a number of individual coil elements. In newer imaging methods, for example in parallel imaging, the raw data respectively received by a number of coil elements are processed into MR images. In such methods the raw data of each coil element are separately conducted from the antenna array into a plug of the antenna array and supplied to the reception channels via this plug.

An example for an antenna array is a spinal column surface unit, also called a spine array. In such an antenna array with, for example, 24 coil elements, 12 coil elements, for example, cover the maximum acquisition volume (field of view FOV). This array thus requires at least twelve channels at the plug that are to be connected with twelve reception channels.

Particular coil elements that are not necessary for a given examination are detuned with regard to their resonance frequency with detuning circuits. The activation of such a detuning circuit for a coil element typically occupies a control signal line in the plug of the antenna unit. In conventional detuning circuits, a certain forward current typically is provided by the MR apparatus in the detuned state (inactivate state) to a PIN diode. In the active case, i.e. without detuning, a certain blocking voltage is applied to the PIN diode.

Unnecessary antennas are switched to the inactive state by the detuning circuits. For example, receiving antennas are switched to be inactive during the transmission mode and transmitting antennas are switched to be inactive during the reception mode. In addition to transmission using a whole-body antenna mentioned above, a B1 magnetic field can be radiated with good spatial localization by a local antenna array.

A problem in the use of raw data from a number of coil elements is the limited space for channels and control signal lines in the plug of the antenna array, which limits the number of the reception channels and the number of the control signal lines that can be available.

SUMMARY OF THE INVENTION

An object of the present invention is to provide a selector switch with a simple design and a method to switch between at least two antenna units, wherein only a few control signal lines are necessary for the activation of the antenna units.

The above object is achieved in accordance with the invention by an antenna selector switch operating a number of antenna units of a magnetic resonance apparatus via an RF channel with at least two antenna connectors for making a connection with each antenna unit, wherein at least a first of the antenna units can be adjusted with regard to its resonance frequency via a first control signal. The selector switch further has an RF channel connector for making a connection with a radio frequency unit of the magnetic resonance apparatus; and a switching unit to make a radio frequency connection between one of the antenna connectors and the RF channel connector, the switching unit being activated by a control signal.

The inventive antenna selector switch has the advantage that no additional control signal (and thus no additional control signal line) is necessary to activate the antenna selector switch, since the control signal of the detuning circuit is also used for the activation of the switching unit. This is possible since the detuning of an antenna until and the selection of an antenna unit for an RF channel connector are dependent on one another.

The tuning or detuning of the resonance frequency of the antenna unit typically ensues with a detuning circuit. The control signal can assume a first detuning state in which the resonance frequency of the first antenna unit is tuned to receive or transmit, or it can exhibit a second detuning state in which the resonance frequency of the first antenna unit is detuned.

The above object also is achieved by a method for switching between at least two antenna units, wherein at least a first of the antenna units is adjusted with regard to its resonance frequency by a control signal with such an antenna selector switch, with the antenna selector switch being activated by the control signal.

The term "antenna unit" as used herein means both an individual antenna, i.e. an antenna with one coil element, and an antenna array with a number of coil elements.

In an embodiment of the antenna selector switch, if the control signal is in the first detuning state, the switching unit is in a first switch state in which a radio frequency connection exists between the antenna connector to be connected with the first antenna unit and the RF channel connector. By contrast, if the control signal is in a second detuning state the switching unit is in a second switch state in which a radio frequency connection exists between the antenna connector to be connected with the second antenna unit and the RF channel connector.

In another embodiment of the antenna selector switch, the switching unit having a first switch that includes a connection with the first control signal, the first switch being disposed between the antenna connector to be connector with the first or the second antenna unit and the RF channel connector, and connects these in terms of radio frequency in the first switch state and separates these in terms of radio frequency in the second switch state.

The crossed-over activation of the first switch and the second antenna unit has the advantage that simple circuits are possible given pairs of antenna units to be activated that are always alternately active. By contrast, the parallel embodiment, in which the first switch is activated together with the first antenna unit by the first control signal, has the advantage that it can be more easily modularly expanded.

In a further embodiment of the antenna selector switch, the control signal is a direct current/direct, voltage signal and the switching unit has a diode that is connected in terms of radio frequency with one of the antenna connectors and with the RF channel connector, and that also is connected in terms of direct current with the direct current/direct voltage signal.

The use of a diode has the advantage that, if a PIN diode is also used in the detuning circuit of the antenna unit, it is particularly simple to use the control signal for both functions. In the case of the PIN diode, the direct current-direct voltage source for the direct current-direct voltage signal is connected with one or with both connection sides of the PIN diode.

In another advantageous embodiment of the method, the control signal (when it tunes the resonance frequency of the first antenna unit for reception) activates the switching unit of the antenna selector switch such that a radio frequency connection is generated between the antenna connector to be connected with the first antenna unit and the RF channel connector.

DESCRIPTION OF THE DRAWINGS

FIG. 1 schematically shows the design and the use of an antenna selector switch according to the invention.

FIG. 2 shows an example for a scalable switching unit as can be used in an antenna selector switch according to the invention.

FIG. 3 shows an embodiment of the antenna selector switch of FIG. 1 for two detunable antenna units.

FIG. 4 shows an alternative embodiment for the activation according to FIG. 3.

DESCRIPTION OF THE PREFERRED EMBODIMENTS

Figure 5:
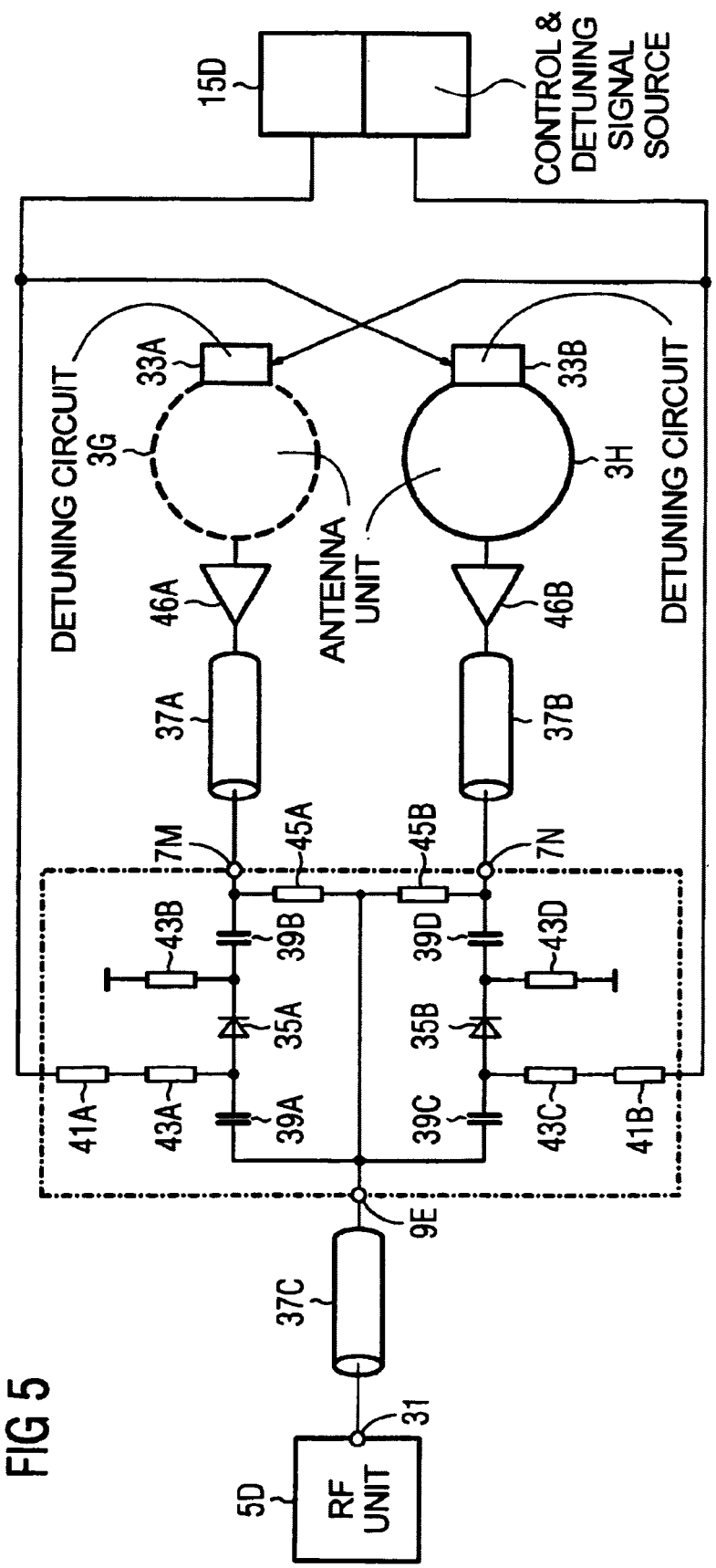
FIG. 5 is a block diagram of an antenna selector switch corresponding to FIG. 4.

In general, a reduction of the necessary RF channels of a plug of an antenna array is achieved in accordance with the invention by using a common (shared) reception channel for a number of coil elements, of which only one is active at a time in each relevant array combination. The selection as to which of the coil elements should be activated ensues with a control signal, which also activates the operating state of one of the coil elements.

FIG. 1 schematically shows the design and the use of an antenna selector switch 1 according to the invention. It enables the switch between two antenna units 3A, 3B, such that only one signal from one of these antenna units 3A, 3B is conducted to a radio frequency unit 5. Alternatively, the antenna selector switch enables transmission of a radio frequency signal from the RF unit 5 to only one of the antenna units 3A, 3B during the transmission mode. Due to the independence of the antenna selector switch 1 with regard to its use for transmission or reception, in the following the reception case is described as an example.

The antenna unit 3A has only one coil element, in contrast to which the antenna unit 3B is an antenna array having, for example, three coil elements with only one mutual output that can be mutually detuned.

The antenna units 3A, 3B are respectively connected with antenna connectors 7A, 7B. The radio frequency unit 5 is connected with the RF channel connector 9A. The radio frequency connection of the antenna connectors 7A, 7B with the RF channel connector 9A ensues via a switch unit 11 that is activated by a control signal 13 of a signal source 15. The control signal 13 also tunes or detunes the antenna unit 3A (active and inactive operating states).

The switching unit 11 shown in FIG. 1 can be expanded to an arbitrary number of antenna units. This is schematically shown in FIG. 2 using the switching unit 11A, which respectively connects one of the antenna connectors 7C, ... 7G with the RF channel connector 9B in terms of radio frequency. The switching unit 11A preferably handles only existing control signals and operating voltage, if present, for example via the preamplifier, such that the number of control signal lines still is minimized.

A particular advantage of the antenna selector switch according to the invention is that no additional control signal lines or control signals are necessary for the antenna selector switch, for example for the activation of the PIN diodes as shown in FIG. 5. Rather, the tuning or detuning control signals of the antenna units are used for this purpose, which then serve both for operating the antenna selector switch and for detuning of the antenna units in the transmission mode or tuning in the reception mode.

FIG. 3 shows an embodiment of an antenna selector switch 1B with a symmetrical design with two switches 21A, 21B that either produce a radio frequency connection with the antennas 3C and 3D or separate these antennas 3C and 3D. The antenna units 3C, 3D are tuned or detuned by respective control signals 13C and 13D. In addition to the detuning of the antenna units, the control signals 13C, 13D also affect opening or closing of switches 21A, 21B, i.e. to establish a radio frequency connection. The connections of the antenna selector switch 1B with the RF unit 5B or with the antenna units 3C, 3D preferably ensues via schematically shown coaxial cables. The control signals 13C, 13D are in turn generated by a detuning unit 15B.

FIG. 4 shows an exemplary embodiment as an alternative to FIG. 3, wherein the control signals 13E, 13F cross, detuning one of the antenna units 3E and 3F and closing or separating the radio frequency connection of an RF channel connector 9D from the other of the antennas 3F and 3E via switches 21E, 21F. This has the advantage that, for example, a PIN diode for establishing a radio frequency connection of the RF channel connector 9D with one of the antennas 3E, 3F, and a further PIN diode to form a blocking resonance circuit to detune the other of the antennas 3F, 3E, can be simultaneously activated with the same control signal 13F, 13E. When current flows through the respective PIN diode, it is switched to a conductive state.

The inventive antenna selector switch can be used (as described above) both for transmission and in reception. In the following, an example is given in detail for an antenna selector switch according to FIG. 4 that, for example, can be repeated multiple times in the previously mentioned spinal column coil unit. The necessary number of reception channel lines is thereby halved without additional signal lines being introduced.

Since twelve read-out coil elements cover the maximum field of view (FOV), a plug for a spinal column coil unit requires at least twelve reception channels. Due to the size of the FOV, in every relevant combination of coil elements there are always twelve pairs of individual coils, of which one is active and one is inactive. Using twelve antenna selector switches according to FIG. 5, it is possible to receive data from these coils out in pairs via the twelve reception channels by suitable combinations of the coil elements.

The functioning of the individual antenna selector switches thus corresponds to a form of reception diplexer. The signal is directed from one coil elements of the pair at a time to the reception channel, followed by the signals of the other coil element being directed once to the antenna channel.

Activation of the selector switch intensively ensues via the control signals that are already present for detuning the coil elements.

FIG. 5 shows a block diagram of an antenna selector switch 1D for operating two coil elements 3G, 3H of a magnetic resonance apparatus with an RF channels 31 of an RF unit 5D. Since only one of the coil elements 3G, 3H is present at a time in the possible FOV of the magnetic resonance apparatus, the coil elements 3G, 3H should be able to be alternatively, connected in terms of radio frequency with the RF channel connector 31. The connections ensue via coaxial cables 37A, 37B, 37C, and the antenna selector switch 1D switches between the inner lines of the coaxial cables 37A, 37B. One PIN diode 35A, 35B per pair is used as a switch, the PIN diodes 35A, 35B being integrated into the RF connections at the coil elements 3G, 3H and serially separating or closing the inner lines of the respective reception coaxial cables 37A, 37B. Given a current feed, the PIN diodes 35A, 35B exhibit a conductive state for radio frequency signals, and given a blocking direct voltage they exhibit a blocking state for radio frequency signals.

The antenna units 3G, 3H can be tuned or detuned in terms of the resonance frequency of their antenna, resonant circuits by the detuning circuits 33A, 33B. The detuning can ensue, for example, by activating a blocking resonant circuit with the resonance frequency of the antenna that represents a high-ohmic point in the antenna resonant circuit, for example with one of the PIN diodes 35A, 35B. Alternatively, the resonance frequency can be shifted by bridging a capacitor that determines the resonance frequency is, for example with one of the PIN diodes 35A, 35B.

For detuning, the detuning circuit generates (for example via a direct current/direct voltage path) control signals 13G, 13H in a detuning control unit 15F. The detuned antenna unit 3G is shown dashed and the antenna unit 3H tuned to resonance frequency is show with solid lines.

Detuning PIN diode in the detuning circuits 33A, 33B, in the tuned (reception-ready) state, are typically provided by the detuning control unit 15D with a blocking voltage, and in the detuned state are provided by the detuning control unit 15D with a forward current. In the shown case, the control signal 13H of the coil unit 3G corresponds to this forward current and the control signal 13G corresponds to this blocking voltage. Since, in the case of the spinal column coil unit described here, either the one or the other coil element 3G, 3H is active, the states of the associated detuning circuits 33A, 33B are never identical but are always alternating. Thus the following two case can occur.

In the first case, the coil element 3G is detuned and coil element 3H is tuned to resonance frequency. The detuning circuit 33A is fed current and blocking voltage is applied to the detuning circuit 33B.

In the opposite second case, the coil element 3H is detuned and coil element 3G is tuned to resonance frequency. The detuning circuit 33B is; correspondingly fed current and blocking voltage is applied to the detuning circuit 33A.

In the embodiment in FIG. 5, the blocking voltage or the flowing current presented by the control unit 15D inventively serve not only as a control signal for the detuning circuits 33A, 33D, but also serve for the activation of the PIN diodes 35A, 35B via further direct current/direct voltage paths.

The PIN diodes 35A, 35B are switched either to be conducting or blocking with the direct current-direct voltage signals 13G, 13H. Closing and decoupling of the direct current paths from the RF paths respectively ensue with two capacitors 39A, . . . 39D and two coils 43A, . . . 43D that are respectively connected at the cathode and anode sides of the respective PIN diodes 35A, 35B. Resistors 41A, 41B serve for voltage matching.

In the following, the functioning of the antenna selector switch 1D in both of the cases described above is explained. In the first case, the coil element 3G is detuned and the coil element 3H is switched to reception. The RF connection via the PIN diode 35A, which is connected in series with the coil element 3G, must be interrupted (operated with blocking voltage). For this purpose, in the shown circuit the blocking voltage is use that, in the detuning circuit 33B, tunes the connected coil element 3H for reception. In contrast, the PIN diode 35B connected in series with the coil 3H must be switched to be conducting in terms of radio frequency, i.e., it must be fed with current. For this purpose, the detuning signal of the detuning circuit 33A of the coil element 3G is used.

In the second case, in which the coil element 3G is switched for reception and the coil element 3H is detuned, the control signals providing blocking voltage and current feed are exchanged, such that the switching states of the PIN diodes 35A, 35B are also exchanged.

In addition to the typical case described herein of the activation of the PIN diodes for detuning or tuning of the coil elements, the coil elements can also be detuned with a blocking voltage and tuned with a forward current. The circuit must be correspondingly modified.

Additionally, in FIG. 5 preamplifiers 46A, 46B of the coil elements 3G, 3H are supplied with direct voltage via the inner conductors of the reception coaxial cables 37A, 37D. This voltage supply is directed to the PIN diodes 35A, 35B by suitable choke coils 45A, 45B and the additional capacitors 39A, . . . 39D serve as blocking capacitors.

Although modifications and changes may be suggested by those skilled in the art, it is the intention of the inventors to embody within the patent warranted hereon all changes and modifications as reasonably and properly come within the scope of their contribution to the art.

We claim:

1. An antenna selector switch connected to an RF channel of a magnetic resonance apparatus for selectively connecting a selected antenna unit, from among a plurality of antenna units, to said RF channel, said antenna selector switch comprising:

at least two antenna connectors for connection to said selected antenna unit, one of said connectors carrying a control signal for adjusting the resonance frequency of the selected antenna unit;

an RF channel connector adapted for connection with a radio frequency unit in said RF channel; and a switching unit for producing a radio frequency connection between one of said antenna connectors and said RF channel connector, said switching unit being activated by said control signal that adjusts the resonance frequency.

2. An antenna selector switch as claimed in claim 1 wherein said control signal exhibits a detuning state in which said resonance frequency of said selected antenna unit is tuned for reception.

3. An antenna selector switch as claimed in claim 2 wherein said detuning state is a first detuning state, and wherein said control signal exhibits a second detuning state in which the resonance frequency of the selected antenna unit is detuned.

4. An antenna selector switch as claimed in claim 2 wherein, if said control signal exhibits said detuning state, said switching unit is switched to a switching state producing a radio frequency connection between said one of said antenna connectors and said RF channel connector.

5. An antenna selector switch as claimed in claim 4 wherein said detuning state is a first detuning state, and wherein said control signal exhibits a second detuning state in which the resonance frequency of the selected antenna unit is detuned, and wherein said switch state of said switching unit is a first switch state, and wherein, if said control signal exhibits said second switching state, said switching unit is switched to a second switch state for producing a radio frequency connection between said one of said antenna connectors connected to a second of said plurality of antenna units and said RF channel connector.

6. An antenna selector switch as claimed in claim 1 wherein said switching unit detunes a second of said plurality of antenna units with a second control signal exhibiting two detuning states.

7. An antenna selector switch as claimed in claim 6 wherein said switching unit comprises a first switch producing a connection to one of said first or second control signals, said first switch being connected between said one of said antenna connectors and said RF channel connector, said first switch connecting said one of said antenna connectors to said first or second antenna unit in terms of radio frequency in said first switch state and separating said first and second antenna units in terms of radio frequency in said second switch state.

8. An antenna selector switch as claimed in claim 7 wherein said switching unit comprises a second switch forming a connection to said first or second control signal, said second switch being connected between said one of said antenna connectors and said RF channel connector, and connecting said first or second antenna unit in terms of radio frequency in said first switch state and separating said first and second antenna units in terms of radio frequency in said second switch state.

9. An antenna selector switch as claimed in claim 1 wherein said control signal is a direct current/direct voltage control signal, and wherein said switching unit comprises a PIN diode connected in terms of radio frequency with said one of said antenna connectors and to said RF channel connector, and being supplied with said direct current/direct voltage control signal.

10. A method for operating an antenna selector switch connected to an RF channel of a magnetic resonance apparatus for selectively connecting a selected antenna unit, from among a plurality of antenna units, to said RF channel, comprising the steps of:

providing at least two antenna connectors in said selector switch for connection to said selected antenna unit, and supplying a control signal to one of said connectors for adjusting the resonance frequency of the selected antenna unit;

connecting an RF channel connector of said selector switch with a radio frequency unit in said RF channel; and activating a switching unit in said selector switch with said control signal that adjusts the resonance frequency for producing a radio frequency connection between one of said antenna connectors and said RF channel connector.

11. A method as claimed in claim 10 comprising tuning the resonance frequency of said selected antenna unit with said control signal for placing said selected antenna unit in a reception mode and activating said switching unit with said control signal to produce a radio frequency connection between said one of said antenna connectors and said RF channel connector.

12. A method as claimed in claim 11 comprising detuning the resonance frequency of said selected antenna unit with said control signal, and activating said switching unit with said control signal for producing a radio frequency connection between said one of said antenna connectors and said RF channel connector.

* * * * *